(12) United States Patent
Leschkies et al.

(10) Patent No.: US 8,895,351 B2
(45) Date of Patent: Nov. 25, 2014

(54) METHOD AND APPARATUS OF FORMING A CONDUCTIVE LAYER

(71) Applicant: Applied Materials, Inc., Santa Clara, CA (US)

(72) Inventors: Kurtis Leschkies, Santa Clara, CA (US); Steven Verhaverbeke, San Francisco, CA (US); Robert Visser, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 54 days.

(21) Appl. No.: 13/656,485

(22) Filed: Oct. 19, 2012

(65) Prior Publication Data

US 2013/0102110 A1    Apr. 25, 2013

Related U.S. Application Data

(60) Provisional application No. 61/549,142, filed on Oct. 19, 2011.

(51) Int. Cl.
*H01L 21/00*    (2006.01)
*H01L 31/0392*    (2006.01)
*H01L 31/0224*    (2006.01)

(52) U.S. Cl.
CPC .. *H01L 31/022425* (2013.01); *H01L 31/03921* (2013.01); *Y02E 10/50* (2013.01)
USPC ........................................................ 438/98

(58) Field of Classification Search
USPC ........................ 438/98, 758, 780, 781, 789
See application file for complete search history.

(56) References Cited

FOREIGN PATENT DOCUMENTS

EP    508399 A2 * 10/1992

* cited by examiner

*Primary Examiner* — Brook Kebede
(74) *Attorney, Agent, or Firm* — Patterson & Sheridan, LLP (57) ABSTRACT

The present invention generally includes an apparatus and process of forming a conductive layer on a surface of a host substrate, which can be directly used to form a portion of an electronic device. More specifically, one or more of the embodiments disclosed herein include a process of forming a conductive layer on a surface of a substrate using an electrospinning type deposition process. Embodiments of the conductive layer forming process described herein can be used to reduce the number of processing steps required to form the conductive layer, improve the electrical properties of the formed conductive layer and reduce the conductive layer formation process complexity over current state-of-the-art conductive layer formation techniques. Typical electronic device formation processes that can benefit from one or more of the embodiments described herein include, but are not limited to processes used to form solar cells, electronic visual display devices and touchscreen type technologies.

19 Claims, 10 Drawing Sheets

FIG. 1

(PRIOR ART)

METHOD AND APPARATUS OF FORMING A CONDUCTIVE LAYER

CROSS-REFERENCE TO RELATED APPLICATIONS

This application claims benefit of U.S. provisional patent application Ser. No. 61/549,142, filed Oct. 19, 2011, which is herein incorporated by reference.

BACKGROUND OF THE INVENTION

1. Field of the Invention

Embodiments of the present invention generally relate to a process and apparatus of forming a conductive layer containing metal fibers on a substrate.

2. Description of the Related Art

Figure 1:
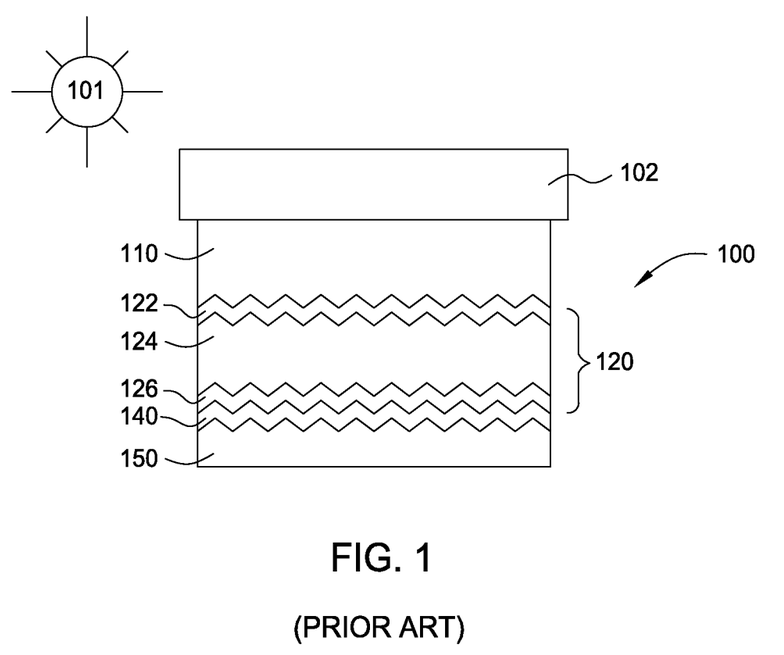
FIG. 1 is a side cross-sectional view of a conventional thin film solar cell device.

Many electronic devices, such as solar cells, LCD displays and touchscreen technologies use transparent conductive oxide (TCO) films as electrodes to provide a low-resistance electrical contact to a device's active layers. Transparent conductive oxide films are optically transparent and thus allow the passage of light through these conductive layers. In single- and tandem-junction thin-film silicon solar technologies, one or more of the electrical contacts are typically made from a deposited TCO layer that is connected to an active region of the solar cell device, such as the p-i-n junction. An example of a TCO containing thin film solar cell device 100 is shown in FIG. 1. In this example, the solar cell 100 may comprise a substrate 102 (e.g., glass substrate), a first transparent conducting oxide (TCO) layer 110 (e.g., zinc oxide (ZnO), tin oxide (SnO)), a first p-i-n junction 120, a second TCO layer 140 and a metal back contact layer 150, which when in use is oriented toward a light source 101 as shown. The first p-i-n junction 120 may comprise a p-type amorphous silicon layer 122, an intrinsic type amorphous silicon layer 124 formed over the p-type amorphous silicon layer 122, and an n-type amorphous silicon layer 126. In the p-i-n junction layer, incident sunlight (e.g., solar radiation 101) is absorbed and photogenerated electrons and holes are created, separated from one another, and finally transported to the opposite collection electrodes, such as TCO layer 110 and second TCO layer 140, and metal back contact layer 150, thus generating a photocurrent.

However, metal oxides used to form the TCO layers possess a number of disadvantages that reduce the absolute efficiency of a solar cell device, or affect the usability of other types of electronic devices. For example, one must balance optical transparency of the formed layer and its sheet resistance, where, for example, a thicker film or higher doping level in the metal oxide layer will lead to higher conductivities, but drastically reduce the ability of the film to transmit the incident light. For typical solar cells, this can translate to a photocurrent loss of 3 mA/cm$^2$. Secondly, the low work-function of the metal oxide is often mismatched to the abutting active layer, which reduces the photovoltage in a device and requires the need for additional non-active corrective film layers that also absorb useful light. Finally, the cost associated with forming a TCO coating is quite expensive, such as between \$7-\$9/m$^2$ of device area.

Thin-film solar, display, and touchscreen technologies are currently looking towards using metallic nanowires as a replacement for metal oxide films to replace the TCO layers. The metallic nanowires can be fabricated entirely from a solution and deposited onto a substrate using simple deposition methods. Current state-of-the-art electrically-conductive nanowire containing layers are based on random mesh networks deposited onto a substrate surface.

Random mesh networks of electrically-conductive nanowires can be deposited onto substrate surfaces using a variety of techniques and technologies. One such example of a simple and versatile method for fabricating ultrafine fibers with diameters ranging from nanometers to micrometers (i.e., nanofibers) is electrospinning. In a typical electrospinning procedure, a high voltage is applied to a metallic capillary, which is connected to a reservoir holding a polymer-containing solution with proper viscosity, conductivity, and surface tension. In some cases, this solution can be a composite, consisting of a number of various polymers and/or metal salts. The surface tension of the polymer solution can be overcome with a sufficiently high electrical field causing ejection of a thin fibrous jet of a metal-polymer material that can be collected onto a rigid or flexible substrate. Since the nanofibers are electrically insulating at this point, they must be further processed (e.g., metallicized) in order to conduct electricity.

The current state-of-the-art process of forming a conductive layer using an electrospinning process typically includes at least three separate processing steps. First, an electrically-insulating electrospun nanofiber, which comprises a metal salt and organic binding agent, is deposited on a surface of a collecting substrate. Next, the electrically-insulating nanofibers are converted to electrically conductive metallic nanofibers in two separate subsequent processing steps. In the first post electrospinning deposition step, the metal-polymer fibers are oxidized at high temperatures (~500° C.) in order to remove the insulating polymer from the deposited metal salt and organic binding agent matrix. In the next post electrospinning deposition step, the now-converted metal oxide fibers are then "metallicized," or the conductivity of the formed nanowires is improved, by placing them in contact with a reducing gas while maintaining the wires at about 250° C. for greater than about 2 hours, which is very time consuming, and as will be discussed below, not effective in metalizing the fibers. While these processes have proven to be adequate in producing metallic fibers, there are a number of inherent disadvantages with the current state-of-the-art processing techniques. For example, the current-state-of-the-art processes restrict one to hard, rigid collecting substrates only, in order to withstand the high temperatures associated with the oxidation process. One cannot directly deposit and process the electrospun electrically-insulating nanofibers directly onto a thin, flexible and/or polymeric or organic material containing substrate and then perform the nanofiber conversion processes, due to the risk of melting or damaging the substrate or layers formed thereon. Therefore, in order to form the nanowires on a flexible substrate, or substrate containing polymeric or organic material containing materials, the electrically-insulating electrospun nanofibers must first be spun onto a rigid high temperature resistant substrate (e.g., glass) and then be transferred after processing to a desirable flexible or polymeric material containing substrate, which adds another post processing step (e.g., 4$^{th}$ processing step). These conductive layer forming process steps thus make the process of forming next generation solar cells, LCD displays and touchscreen devices at a low cost challenging, if not impossible.

Therefore, there is a need for an apparatus and method of efficiently forming an electrospun conductive layer on a surface of a substrate that does not contain the drawbacks discussed above.

SUMMARY OF THE INVENTION

The present invention generally includes an apparatus and process of forming a conductive layer on a surface of a host substrate, which can be directly used to form a portion of an electronic device. One or more of the embodiments disclosed herein include a process of forming a conductive layer on a surface of a substrate using an electrospinning deposition process. Typical electronic device formation processes that can benefit from one or more of the embodiments described herein include, but are not limited to processes used to form solar cells, electronic visual display devices (e.g., LCD display, plasma displays, OLED display) and touchscreen type technologies.

Embodiments of the present invention may provide a method of forming a conductive layer on a substrate, comprising depositing a metal salt containing polymeric material on a surface of a substrate, reducing the pressure in a processing region of a first processing chamber to a pressure below 760 Torr, heating the substrate, to a first temperature between about 25° C. and about 250° C., and exposing the substrate to an activated process gas from a gas delivery device disposed in the processing region to the deposited metal salt containing polymeric material.

Embodiments of the present invention may further provide a system for forming a conductive layer on a substrate, comprising a conductive nozzle positioned over a surface of a first substrate support that is disposed in a first processing region, a first power source coupled to the conductive nozzle and an electrode that is disposed adjacent to the surface of a first substrate support, a gas delivery device having a plurality of holes formed through a face formed thereon, wherein the plurality of holes are in fluid communication with a second processing region, a plurality of wires disposed a distance from the face of the gas delivery device, a second power source coupled to at least one of the plurality of wires, and a gas source that is fluidly coupled to the gas delivery device, wherein the gas source is configured to deliver a reducing gas to the second processing region.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that features of one embodiment may be incorporated in other embodiments without further recitation.

DETAILED DESCRIPTION

The present invention generally includes an apparatus and process of forming a conductive layer on a surface of a device substrate, which can be directly used to form a portion of an electronic device. More specifically, one or more of the embodiments disclosed herein include a process of forming a conductive layer on a surface of a substrate using an electrospinning type deposition process. Embodiments of the conductive layer forming process described herein can be used to reduce the number of processing steps required to form the conductive layer, improve the electrical properties of the formed conductive layer and reduce the conductive layer formation process complexity over current state-of-the-art conductive layer formation techniques. Typical electronic device formation processes that can benefit from one or more of the embodiments described herein include, but are not limited to processes used to form solar cells, electronic visual display devices and touchscreen type technologies.

As noted above, current state-of-the-art processes used to convert electrospun electrically-insulating nanofibers into metallic nanowires involve at least three processing steps, which generally include: 1.) depositing the electrically-insulating nanofibers, 2.) oxidizing the deposited fibers at a high temperature (~500° C.) and 3.) then further processing the nanofibers to form metallic nanowires. One disadvantage of the current state-of-the-art processes include the inability of these processes to directly deposit and process the electrospun nanofibers on a thin, flexible and/or polymeric or organic material containing substrate that can be directly used in an electronic device. In an effort to reduce cost, improve durability and/or weight of typical state-of-the-art electronic devices, typical substrates are desirably formed from a polymeric or organic containing material, such as polyethylene terephthalate (PET), polyvinyl fluoride (PVF), polyester, polypropylene, Mylar, polyimide, kapton or polyethylene. In some configurations, the substrate may comprise a 10-10,000 μm thick polymeric or organic containing material. In one example, the substrate comprises a 175 μm thick sheet of polyethylene terephthalate (PET). However, in some cases it may still be desirable to form an electrospun layer on other types of substrates, such as a glass substrate.

Figure 2A:
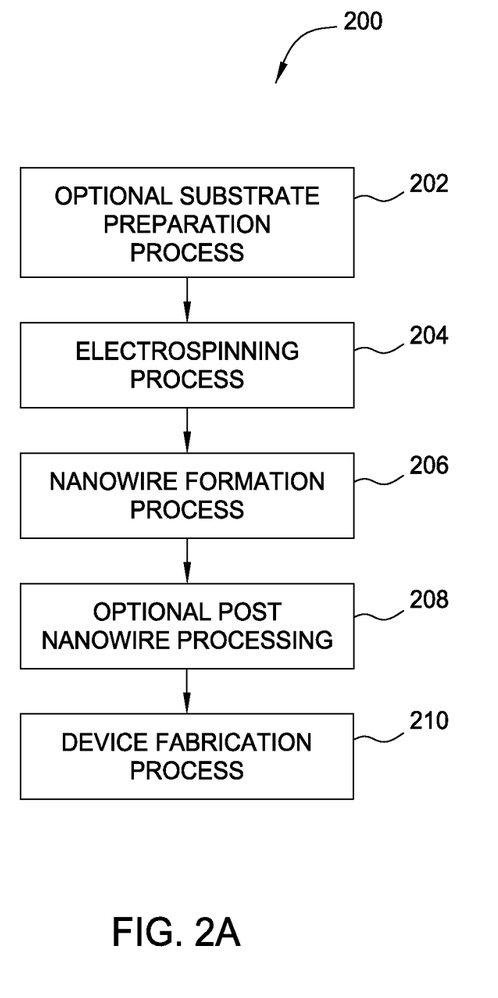
FIG. 2A is a flow chart illustrating a method for forming a electronic device comprising a deposited conductive layer according to one embodiment of the invention.
Figure 2B:
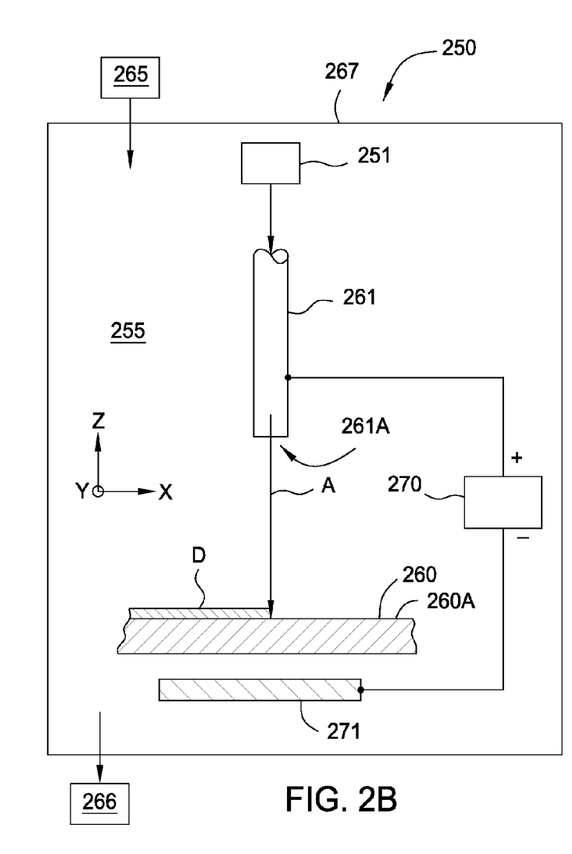
FIG. 2B is a schematic side view of an apparatus for depositing at least a nanofiber containing layer on discrete substrates according to one embodiment of the invention.
Figure 2C:
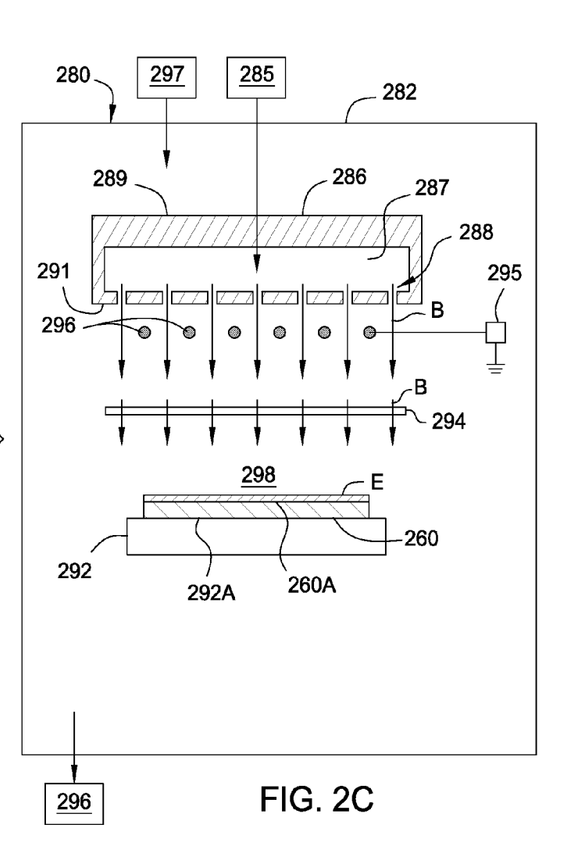
FIG. 2C is a schematic side view of an apparatus used to process the deposited nanofiber layer according to one embodiment of the invention.

FIG. 2A illustrates an embodiment of a conductive layer deposition processing sequence 200 that resolves the disadvantages currently found in the current state-of-the-art. FIGS. 2B-2C schematically illustrate various hardware components that can be used to perform the one or more of the processing steps found in the processing sequence 200. FIGS. 2B and 2C illustrate two processing chambers that can be used to perform at least part of the processing sequence 200. While the chambers 250 (FIG. 2B) and 280 (FIG. 2C) are shown as separate processing chambers, in some cases, in an effort to reduce a system's footprint, it may be desirable to position the hardware components in different parts of a single processing chamber.

At process step 202, as shown in FIG. 2A, an optional substrate cleaning process is performed to remove any undesirable contamination from the surface 260A of the device substrate 260 (FIG. 2B). In one embodiment, the cleaning process includes exposing the surface 260A to a cleaning gas while the substrate is disposed in a vacuum processing chamber. In one example, the cleaning gas may include a halogen containing gas (e.g., $NF_3$) that is activated by use of a remote RF plasma. In another example, the cleaning process step 202 may include exposing the substrate 260 to a wet cleaning solution, which may include spraying, flooding, or immersing the substrate in a solution containing one or more the following materials: a detergent, ozone or DI water. In one configuration, step 202 is performed in a processing chamber 302 (FIG. 3) or 402 (FIG. 4) that is positioned within processing system 300 or 400, respectively, which are both discussed further below.

Next, at process step 204, a layer "D" of electrically-insulating nanofibers are deposited on the surface 260A of the device substrate 260 to form at least a portion of a conductive layer thereon. Referring to FIG. 2B, the electrically-insulating nanofibers can be formed by an electrospinning process. During an electrospinning process, an electrospinning material is delivered from a material reservoir 251 to a conductive nozzle 261, at which point a sufficiently high voltage is applied by a power source 270 to the nozzle 261 so that a liquid droplet disposed at the outlet 261A of the nozzle 261 becomes charged. Next, due to electrostatic repulsion, the surface tension of the charged droplet stretches and eventually brakes, causing a stream of the liquid electrospinning material to be ejected from the nozzle 261 (e.g., Taylor cone) towards an opposing electrode 271 disposed adjacent to at least a portion of the device substrate 260. The electric field lines created between the nozzle 261 and the electrode 271 generally help guide the ejected electrospinning material towards the device substrate 260, which is disposed between the nozzle 261 and the electrode 271. Due to molecular cohesion of the electrospinning material, the ejected stream of material will generally not breakup, thus allowing a continuous, or at least semi-continuous layer of nanofibers to be deposited on the substrate surface 260A. The electrospinning material will generally comprises a conductive fluid that contains a metal salt and a polymeric material, such as copper nitrate ($Cu(NO_3)_2$), or copper acetate ($Cu(CO_2CH_3)_2$), and polyvinyl alcohol (PVA). In one example, the polymeric material disposed in the electrospinning material has a concentration in a range of about 1 to about 35 wt %, more preferably about 3 to about 15 wt %. In one example, the electrospinning material has a viscosity of about 10-50 centipoise (cP). Typical metals used to form the metal salt in the electrospun nanofibers include, but are not limited to copper (Cu), silver (Ag), titanium (Ti), zinc (Zn), tin (Sn), gold (Au), platinum (Pt), palladium (Pd), nickel (Ni), magnesium (Mg), cobalt (Co), and alloys thereof.

A processing chamber 250, which is adapted to perform step 204, may include a processing region 255 that is enclosed by one or more walls 267 to form a controlled environment in which the electrospinning process can be performed. In one configuration, the gas flow direction, gas flow pattern (e.g., laminar or turbulent flow) and composition of gases disposed in processing region 255 is controlled by the delivery of one or more gases from a gas source 265 and/or their removal by an exhaust pump 266 (e.g., vacuum pump, mechanical pump, scrubber).

In one embodiment of step 204, the device substrate 260 is moved relative to the nozzle 261 and electrode 271 by use of substrate transferring system, such as a conveyor 322 (FIG. 3) to assure that a desirable coverage is achieved across the substrate surface 260A (e.g., X and Y plane in FIG. 2B). In another embodiment, the nozzle 261 and/or electrode 271 is moved relative to the device substrate 260 to assure that a desirable uniform or non-uniform coverage of the deposited electrically-insulating nanofibers is achieved across the substrate surface 260A.

Next, at process step 206, as illustrated in FIGS. 2A and 2C, the layer "D" of electrically-insulating nanofibers are processed to form a layer "E" (FIG. 2C) of metallic nanowires on the surface 260A of the device substrate 260. In step 206, the electrically-insulating nanofibers are exposed to an activated processing gas "B" that is delivered through a processing region 298 of a processing chamber 280 to convert the layer "D" directly into a layer "E" of metallic nanowires. In general, the activated process gas may include energetic gas ions, radicals and/or neutrals that are reactive with one or more of the material components found in the deposited nanofibers and not with the device substrate material. In some embodiments, the activated process gas is formed by the delivery of thermal energy, RF energy and/or microwave energy to the process gas. Since the act of electrically biasing or grounding the device substrate 260 to cause ion bombardment of the deposited substrate surface, or exposing the substrate surface to energetic neutrals, can cause damage to a thin and flexible device substrate, it is generally desirable to form gas radicals, as opposed to gas ions or energetic neutrals, which are used convert the electrically-insulating nanofibers to metallic nanowires. In one example, the process gas includes a gas that can be used to breakdown and reduce one or more of the material components in the nanofibers to cause them to from a continuous or semi-continuous layer of nanowires.

The process(es) performed at step 206 will generally include the delivery of an activated gas to the deposited nanofibers, while the nanofibers and device substrate 260 are heated to a desirable processing temperature and the processing environment around the device substrate 260 is maintained at a desirable processing pressure to control the removal of the volatile components from the nanofibers. In one embodiment, the activated processing gas includes a hydrogen containing gas. In one example, the activated processing gas includes a hydrogen ($H_2$) gas and an inert carrier gas (e.g., argon, helium). In one example of step 206, the device substrate 260 is maintained at a processing temperature between about 25° C. and about 250° C. for at least 1 minute, such as between about 5 and about 10 minutes, while a flow of between about 100 and about 400 sccm of hydrogen ($H_2$) is delivered to the substrate surface and the pressure in the processing region 298 is maintained in a range between about 1 mTorr and 760 Torr. In another example, the device substrate 260 is maintained at a processing temperature between about 110° C. and about 230° C., while the processing region 298 is maintained at a process pressure of about 90 mTorr. In one configuration, the composition of gases disposed in processing region 298 is controlled by the delivery of one or more gases from one of the gas sources 285 or 297 and the removal of the gases by an exhaust pump 266 (e.g., vacuum pump, mechanical pump, scrubber), which are both coupled to the processing region 298.

In one embodiment, as illustrated in FIG. 2C, an activated processing gas is formed by flowing a process gas through a gas delivery device 289 (e.g., showerhead type gas distribution device) and then across one or more heated filaments 296 that are heated to a desirable temperature to cause the process gas to become activated. It is believed that this type of thermal activation process has an advantage over other gas activation techniques, since it is less complex, the overall chamber hardware cost is low, it has a high activated species yield (e.g., high activated species to non-activated species ratio) and it is less likely to form gas ions or energetic neutrals. In one configuration, a process gas is delivered to fluid plenum 287 formed in the gas delivery device 289 from a process gas source 285, and then through one or more holes 288 formed in a side 291 of the gas delivery device 289. The process gas exiting the one or more holes 288 then flow past the one or more filaments 296 (e.g., 8-12 wires) that are positioned a distance (e.g., 10-22 mm) from the side 291 to form an activated gas "B" that is delivered to a surface 260A of the device substrate 260. The process gas is thus activated by its interaction with the filaments 296, such as tungsten wires, which are heated to a temperature that is between about 1700° C. and about 2200° C. by the delivery of between about 2100 Watts and about 3600 Watts of power from an AC or DC power source 295. In another example, the process gas is activated by interaction with a filaments 296 that comprises tantalum, which may be heated to a temperature that is between about 1600° C. and about 2000° C., since in some processes it is believed that a tantalum filament will tend not to oxidize or contaminate the deposited layer versus a similarly configured tungsten wire design.

In one configuration of the processing chamber 280, an optional porous shield 294 is positioned between the side 291 of the gas delivery device 289 and the device substrate 260 to reduce the amount of heat flux from the filaments 296 to the device substrate 260. The optional porous shield 294 may be thermally coupled to the chamber walls 282, and/or to an external heat sink (not shown), to control and/or reduce the amount of heat transferred between it and the device substrate 260. The optional porous shield 294 may comprise a metal, ceramic, or glass material that has a plurality of holes or pores formed therein to allow the activated process gas to flow from the gas delivery device 289 to the device substrate 260.

In one configuration, the device substrate 260 is disposed on a surface 292A of a temperature controlled substrate support 292 to assure that a desired substrate processing temperature is achieved during step 206. The temperature controlled substrate support 292 may have one or more fluid type heat exchanging devices, such as the temperature controlling elements 512 (FIG. 5D), that are adapted to regulate the temperature of the device substrate 260. By positioning the device substrate 260 a desired distance from the one or more filaments 296, and/or using a substrate temperature controlling device (e.g., reference numerals 292 or 512), the temperature of the device substrate 260 can be controlled to enhance the properties of the formed nanowires and also not degrade the properties of the sometimes fragile device substrate 260. Thus, by use of a reducing gas delivered to a surface of the substrates 260 that has passed across one or more heated filaments 296, which are disposed in a sub-atmospheric pressure environment, the nanowires can be directly formed on a thin, flexible and/or polymeric or organic material containing substrate. In some configurations, by use of the one or more heated filaments 296, gas delivery device 280 and temperature controlled substrate support 292, and/or optional porous shield 294, the properties of the formed nanowires can be improved, while preventing the properties of the sometimes fragile device substrate from degrading.

Next, at process step 208, the layer "E" (FIG. 2C) of metallic nanowires disposed on the surface 260A of the device substrate 260 may be optionally further processed to improve its electrical properties. In one embodiment of the processing sequence 200, during step 208 a thin layer of transparent conductive oxide (TCO) layer is deposited over the formed nanowires to improve the interconnection between the formed nanowires and overall conductivity of the formed conductive layer. In one example, a TCO layer is deposited over the surface of the nanowires by use of a physical vapor deposition (PVD), atomic layer deposition (ALD) or chemical vapor deposition (CVD) process. Typical TCO films may include between about 1-500 Å of a tin oxide ($SnO_x$), zinc oxide ($ZnO_x$), aluminum doped zinc oxide (AZO), indium tin oxide (ITO), or other similar transparent conductive layer.

In another embodiment of the processing sequence 200, during step 208 the device substrate 260 and formed nanowires are thermally processed to cause recrystallization and/or densification of the formed nanowire structure to improve the interconnection between the formed nanowires and overall conductivity of the formed conductive layer. It is believed that due to the small scale and large surface area of the formed nanowires that the temperatures required to densify and/or recrystallize the nanowire structures can be between about 120° C. and about 300° C. for a form array of pure copper containing 10-10,000 nm diameter nanowires.

In some cases where it is desirable to form random periodic structures, such as for plasmonics applications, or for forming other types of transparent reflective surfaces, it may be desirable to heat the nanowires to a sufficiently high temperature (e.g., near melting point of the metal) during step 208 to cause portions of the formed nanowire to coalesce into smaller islands of metallic material. In this nanowire formation process, the device substrate will need to be formed so that it can withstand the high processing temperatures required to cause the formed nanowires to coalesce.

Next, at process step 210, one or more active device layers are formed over the nanowires to form at least a part of an electronic device on the device substrate 260. The processes performed at step 210 may include multiple processing steps used to form one or more active layers in an electronic device, such as layers used to form a solar cell, electronic visual display devices (e.g., LCD display, plasma displays, OLED display) or touchscreen device. In one example, during step 210 a p-type amorphous silicon layer, an intrinsic type amorphous silicon layer, and an n-type amorphous silicon layer are deposited to form at least a part of a thin film solar cell device on the device substrate 260. The p-type amorphous silicon layer may be formed to a thickness between about 60 Å and about 300 Å, the intrinsic type amorphous silicon layer may be formed to a thickness between about 1,500 Å and about 3,500 Å, and the n-type amorphous silicon layer may be formed to a thickness between about 100 Å and about 400 Å, which may be deposited using a CVD, PECVD or PVD process in one or more processing chambers (e.g., chamber 308 or 408). A back contact layer may be deposited over the formed nanowire containing p-i-n structure to form a back contact of the formed solar cell device, which may comprise a material selected from the group consisting of Al, Ag, Ti, Cr, Au, Zn, Cu, or Pt. Examples of processes that may be used to form a thin film solar cell device on a substrate, which contains the formed nanowires, are further described in the commonly assigned US Patent Application Publication Numbers 20090077805 and 20110174362, which are both herein incorporated by reference.

System Configurations

Figure 3:
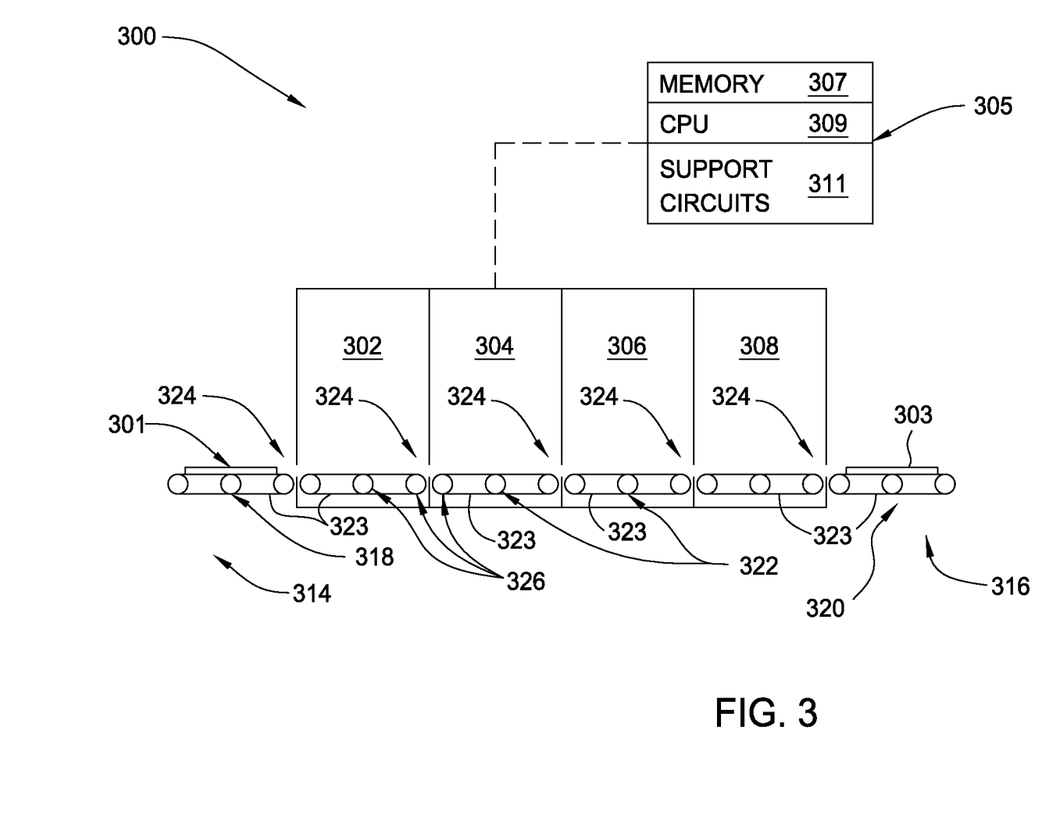
FIG. 3 is a schematic side view of an apparatus for forming a conductive layer on discrete substrates according to one embodiment of the invention.
Figure 4:
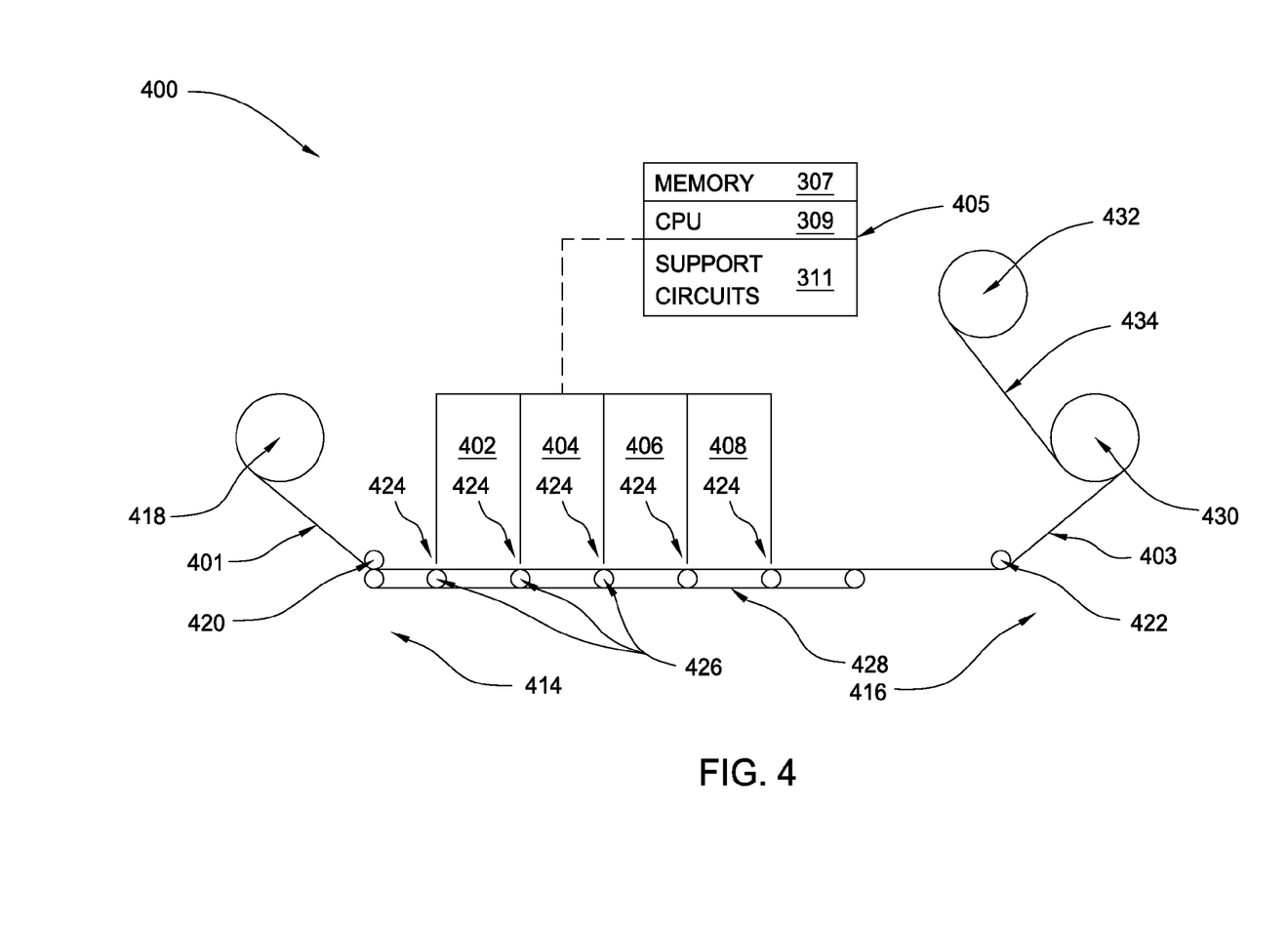
FIG. 4 is a schematic side view of an apparatus for forming a conductive layer on a continuous web of material according to one embodiment of the invention.

FIGS. 3-4 illustrate various system and process chamber configurations that can be used to perform one or more of the processing steps found in the processing sequence 200, which is discussed above. FIG. 3 is a schematic side view of one embodiment of a processing system 300 for forming a conductive layer on a surface of an unprocessed device substrate 301. The processing system 300 generally comprises multiple processing chambers, such as processing chambers 302, 304, 306 and 308 that are used to form a conductive layer on one or more substrates 301. FIG. 4 is a schematic side view of one embodiment of an processing system 400 used to form a conductive layer on at least portions of a large area substrate, such as a substrate comprising a continuous web 401 of material (e.g., roll-to-roll type process). FIGS. 5A-5E are side cross-sectional views that illustrate some of the processing chambers that that could be used in either of the processing systems 300 or 400. While the components shown in FIGS. 5A-5E are generally described with respect to chambers 302, 304, 306, and 308 in the processing system 300, one skilled in the art will appreciate that these chambers could also be adapted and/or positioned within one or more of the processing chambers 402-408 found in the processing system 400 without deviating from the basic scope of the invention described herein.

Referring to FIG. 3, the processing system 300 generally includes a first end 314 where unprocessed substrates 301 enter the processing system 300, and a second end 316 where the processed substrates 303, which have a conductive layer deposited thereon (e.g., layer "E" in FIG. 2C), exit the processing system 300. At the first end 314 an input conveyor 318 supports and guides each of the substrates 301 into a first chamber 302. At the second end 316, an exit conveyor 320 receives each of processed substrates 303 from the process chamber 308. A series of substrate transfer ports 324 are provided at the entrance and exit of the processing system and between each of the chambers 302, 304, 306 and 308 to allow the substrates to pass between chambers, while maintaining the required environment within each of the processing chambers during processing. Details of the ports 324 are described below with reference to chamber 302, and version of the ports 324 are further described in the commonly assigned and copending U.S. Patent Application Publication Number 20110100955, which is herein incorporated by reference.

A series of intermediate conveyors 322 support and guide the substrates through the various chambers. While the conveyor system has been shown with a number of individual conveyors 318, 320 and 322, a single conveyor with a continuous web of supporting material may be used as shown in FIG. 4. In one configuration, the conveyors include support rollers 326 that support and drive the web(s) of conveyor belt material 323 used to convey the substrate(s) through the various chambers. When individual conveyors 318, 320 and 322 are used, the rollers 326 may be mechanically driven (e.g., electric motors) by a common drive system (not shown) such that they are moved in unison, or individually. The various drives for the rollers 326, ports 324 and other system actuators are provided by control signals from a system controller 305. While in one embodiment, as illustrated in FIG. 3, the system 300 comprises four processing chambers, this configuration is not intended to be limiting as to the scope of the invention, since any number of chambers may be provided depending on the types of processing steps found in processing sequence 200. In one embodiment, the processing system 300 also contains at least one additional chamber (not shown) at either or both ends 314, 316 of the system that acts as a load lock to provide a buffer between the environment external to the processing system 300 and the processing regions of the chambers 302-308.

The controller 305, used to control the various components in the processing system 300, generally has a memory 307, a central processing unit (CPU) 309 and support circuits 311. The controller 305 is utilized to control the process sequence of the chambers, regulating the gas flows from gas sources and power application from power sources into the chambers. The CPU 309 may be of any form of a general purpose computer processor that can be used in an industrial setting. The software routines can be stored in the memory 307, such as random access memory, read only memory, floppy or hard disk drive, or other form of digital storage. The support circuits 311 are conventionally coupled to the CPU 309 and may comprise cache, clock circuits, input/output subsystems, power supplies, and the like. The software routines, when executed by the CPU 309, transform the CPU into a specific purpose computer (controller) 305 that controls the process chambers such that the processes are performed in accordance with the present invention. The software routines may also be stored and/or executed by a second controller (not shown) that is located remotely from the processing system 300.

Referring to FIG. 4, processing system 400 generally includes process chambers 402, 404, 406 and 408, which are used to form a conductive layer of a surface of a continuous web 401. The continuous web 401 may comprise a flexible substrate material, such as an organic or polymeric material (e.g., plastics). In one configuration, the continuous web 401 comprises a 100-10,000 µm thick polymeric material, such as polyethylene terephthalate (PET), polyvinyl fluoride (PVF), polyester, polypropylene, Mylar, polyimide, kapton or polyethylene sheet that is positioned between a supply and take-up roll. The processing system 400 has a first end 414 where a supply roll 418 stores the unprocessed portion of the web 401, and also feeds a portion of the web 401 into the first chamber 402. The processing system 400 has a second end 416 where a take-up roll 430 receives and stores a portion of the processed portion of the web 403 that has a conductive layer disposed thereon. At the first end 414 a first diverter roller 420 receives web 401 from the supply roll 418, and diverts the web 401 into the first chamber 402. At the second end 416, a second diverter roller 422 receives the processed web 403 from the final chamber 412 and diverts it to the take-up roll 430. In some embodiments, a roll 432 of a protective web material 434 may be routed into the take-up roll 430. The web of protective material 434 isolates adjacent layers of processed web 403 material, to thereby protect the processed surface of portions of the web 403 while it is being stored for later use.

A series of substrate transfer ports 424 are provided at the entrance and exit of the processing system 400 and between each of the chambers 402, 404, 406 and 408 to allow the web 401 to pass between chambers, while maintaining the required environment within each chamber during processing. Details of the ports 424 are further described in the commonly assigned and copending U.S. Patent Application Publication Number 20110100955, which is herein incorporated by reference. In one configuration, the ports 424 comprise a closeable door 442 that is sealed with the wall and captures the web 401 between the door 442 and a support roller 426. The end of the door 442 that contacts the web 401 may include an elastomeric strip 446 or other similar compliant element that will reduce damage to the web 401 and to provide an effective seal. An actuator 444, extends and retracts the door 442, based on commands from a system controller 405. When the door 442 is in the closed position a sealed chamber is formed between the chamber walls 440, the top of the chamber, and the web 401, which forms the bottom of the chamber. After the process associated with the chamber is performed, the door 442 is opened and the web 401 is advanced for the length of the chamber. The door 442 can then be reclosed and the process performed on another length of the web 401.

During processing, a series of rollers 426 supports the web 401 of material as it is guided through the various chambers. In some embodiments, a drive belt 428 may be included to form a conveyor to provide additional support to the web 401 between the rollers 426. The rollers 426 may be mechanically driven by a common drive system (not shown) such that they are controlled in unison, thereby avoiding wrinkling or stretching of the web 401. While only four processing chambers are shown in FIG. 4, a different number of chambers may be provided in processing system 400 depending on the number of processes that are to be performed therein. In one embodiment, the processing system 400 also contains at least one additional chamber (not shown) at either or both ends 414, 416 of the system, which act as a load lock to provide a buffer between the environment external to the processing system 400 and the processing regions of the processing chambers 402-408. The supply roll 418, take-up roll 430, rollers 426, ports 424 and other system actuators receive control signals from a system controller 405. The controller 405 generally comprises the same elements as described above in conjunction with FIG. 3. One will note that in some configurations, a take-up roll 430 need not be used in the processing system 400, since the web 401 may be cut into sections at the second end 416 of the processing system by a manual or automated web material cutting device. In some configurations, the sectioned portions of the processed web 401 material can then be stacked and/or transported separately to other post processing chambers or systems.

Processing Chambers

Figure 5A:
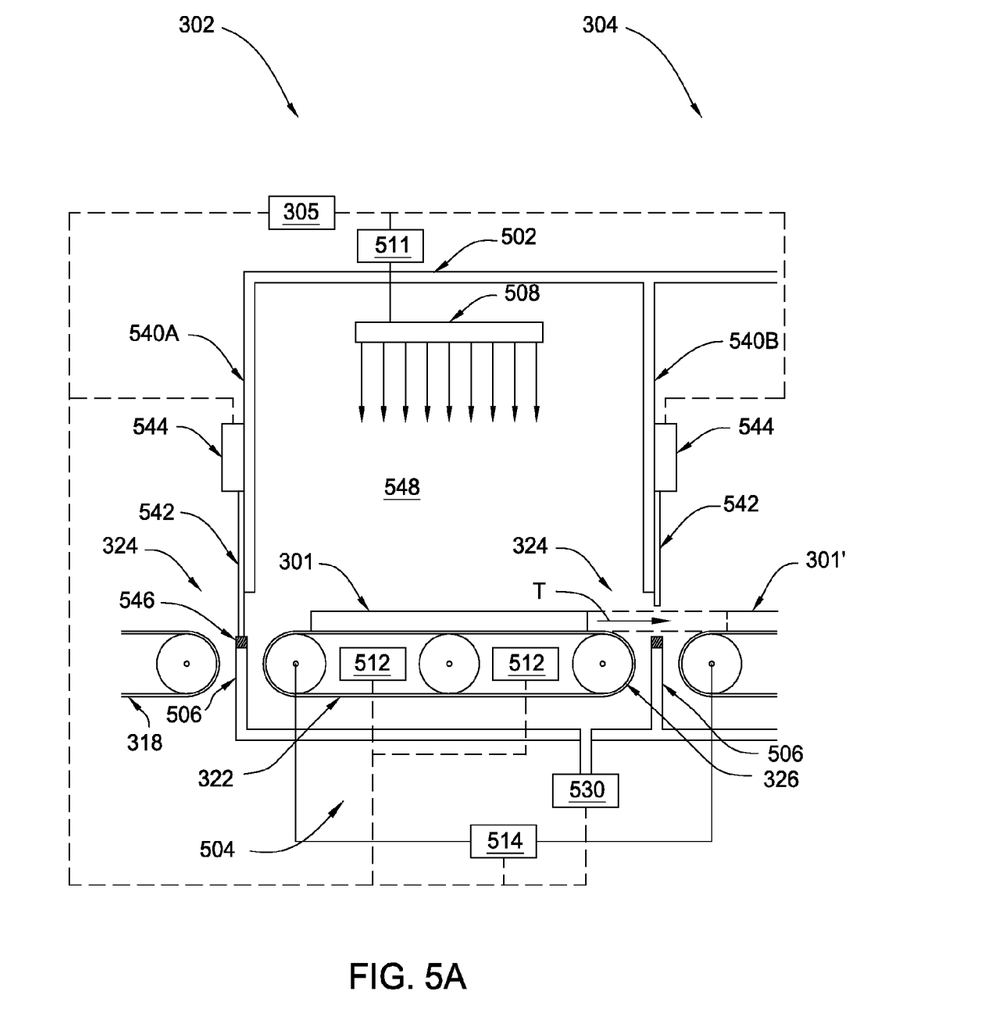
FIG. 5A is a schematic side view of one embodiment of a chamber for processing a conductive layer on substrates according to one embodiment of the invention.

FIG. 5A is a schematic side view of one embodiment of a chamber 302 for preparing a substrate 301 before a conductive layer is formed thereon. The process chamber 302 may be adapted to perform the step 202, which is discussed above. In one configuration, the chamber 302 includes one or more walls that enclose a processing region 548, a gas delivery device 508 and a substrate supporting element, such as a conveyor 322. The chamber 302 is generally adapted to perform a substrate preparation process in which a cleaning gas is delivered to a surface of a substrate 301 disposed on a conveyor 322. The cleaning gas can be delivered to the substrate surface from a gas delivery device 508 (e.g., showerhead) that is coupled to a gas delivery source 511. During processing, one or more substrate temperature controlling elements 512 and a pumping device 530 can be used to control the temperature of the substrate and processing pressure in the processing region 548 by use of commands sent from the controller 305. The substrate temperature controlling elements 512 may comprise resistive heating elements, a peltier device, induction coils, or other heating and/or cooling means that are configured to regulate the temperature of the substrates during processing. In one embodiment, the pumping device 530 may comprise a conventional rough pump, roots blower, turbo pump or other similar device that is adapted control the pressure in the processing region 548. In one embodiment, the pressure level of the processing region 548 of the chamber 302 may be maintained at less than about 760 Torr. In one embodiment, the pressure level of the processing region 548 of the chamber 302 may be maintained at about 1 Torr or less.

In one configuration, chamber 302 includes a first wall 540A facing the first end 314 of processing system 300 and a second wall 540B between chamber 302 and chamber 304 (see FIGS. 3 and 5A). While the second wall 540B is shown as a shared wall between chambers 302 and 304, double walls may be used to provide greater insulation between chambers. Chamber 302 also includes a top wall 502, that may be a common one-piece top for all of the chambers as shown, or each chamber could be provided with a separate top. FIG. 5A also illustrates an embodiment of substrate transfer ports 324 that are positioned on the walls 540A and 540B. Walls 540A and 540B include a lower wall 506 that connects to the chamber bottom 504, below the substrate transfer ports 324. As with the top 502, chamber bottom 504 may be a common one-piece bottom for all of the chambers as shown, or each chamber could be provided with a separate bottom. Each of the substrate transfer ports 324 as shown in FIG. 5A, is generally closeable and is mounted on the chamber wall. A closeable door assembly 542 is sealed with the wall and contacts an elastomeric strip 546 on top of the lower wall 506 of the wall to seal the substrate transfer port 324. An actuator 544, extends and retracts the door assembly 542, based on commands received from the support circuits 311 (FIG. 3) of the system controller 305. When the door assembly 542 is in the closed position as shown on the left in FIG. 5A, the chamber 302 is sealed so that regions on either side of the door assembly 542 are isolated from each other. In one embodiment, the door assembly 542 is a conventional vacuum gate valve that is configured to prevent gas leakage through the substrate transfer port 324. During processing the door assemblies 542 are closed so that a processing region 548 is formed between the chamber walls 540A and 540B, the top 502 of the chamber, and the chamber bottom 504 and door assemblies 542 so that one or more substrate processing steps may be performed therein. After the process associated with each chamber is performed, the door assemblies 542 of each chamber are each separately opened as shown on the right side of FIG. 5A. The conveyor(s) 322 (as well as the input conveyor 318 and the exit conveyor 320) advance the substrates 301 in the direction "T" into the subsequent chamber, based on commands received by a drive mechanism 514 (e.g., motors and motor drivers) from the support circuits 311 (FIG. 3) of the system controller 305, as shown for example by substrate 301'. The door assemblies 542 can then be reclosed and the appropriate processes performed on the next substrate(s) 301.

Figure 5B:
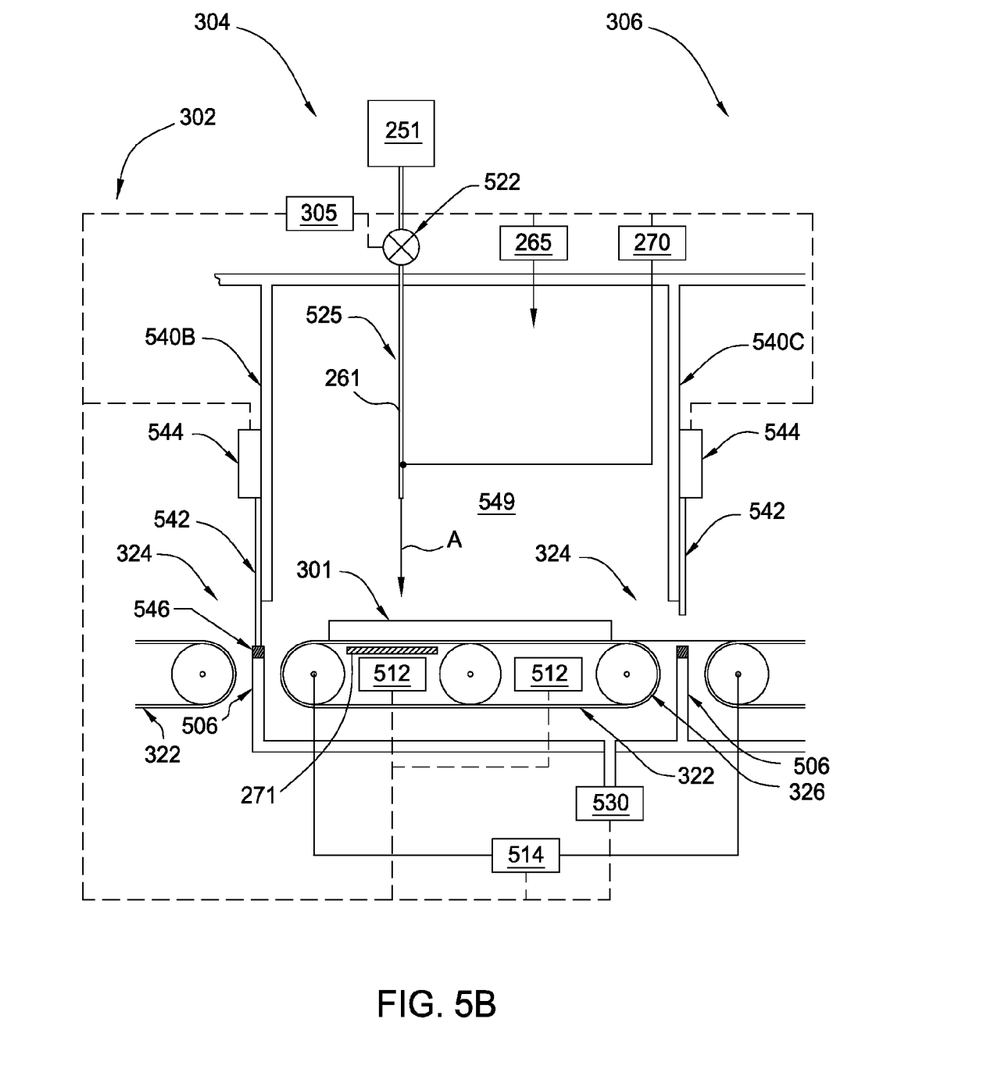
FIG. 5B is a schematic side view of a chamber used to deposit nanofibers on a substrate according to one embodiment of the invention.

FIG. 5B is a schematic side view of one embodiment of a chamber 304 that can be adapted to deposit electrically-insulating nanofibers on a surface of the substrate 301, as discussed in above in conjunction with step 204. In one embodiment, chamber 304 comprises an electrospinning material delivery system 525, a conveyor 322, a gas source 265, a pump 530, one or more door assemblies 542 and one or more walls that enclose a processing region 549. In one configuration, the one or more walls of the chamber 304 include a top wall 502, a first wall 540B disposed between chamber 302 and chamber 304, a second wall 540C disposed between chamber 304 and chamber 306, and a lower wall 506. To facilitate understanding, identical reference numerals have been used, where possible, to designate elements that are common to the FIGS. 5A-5E.

The electrospinning material delivery system 525 generally comprises a material reservoir 251, at least one nozzle 261, at least one opposing electrode 271, a power source 270 coupled to the nozzle(s) 261 and the electrode(s) 271, and an optional shutoff valve 522. As discussed above in conjunction with FIG. 2B, the electrically-insulating nanofibers may be deposited on a surface 301A (FIG. 5C) of the substrate 301 by delivering an electrospinning material from the material reservoir 251 through an electrically biased conductive nozzle 261 and then to a surface of the substrate 301 that is disposed over the opposing electrode 271.

Figure 5C:
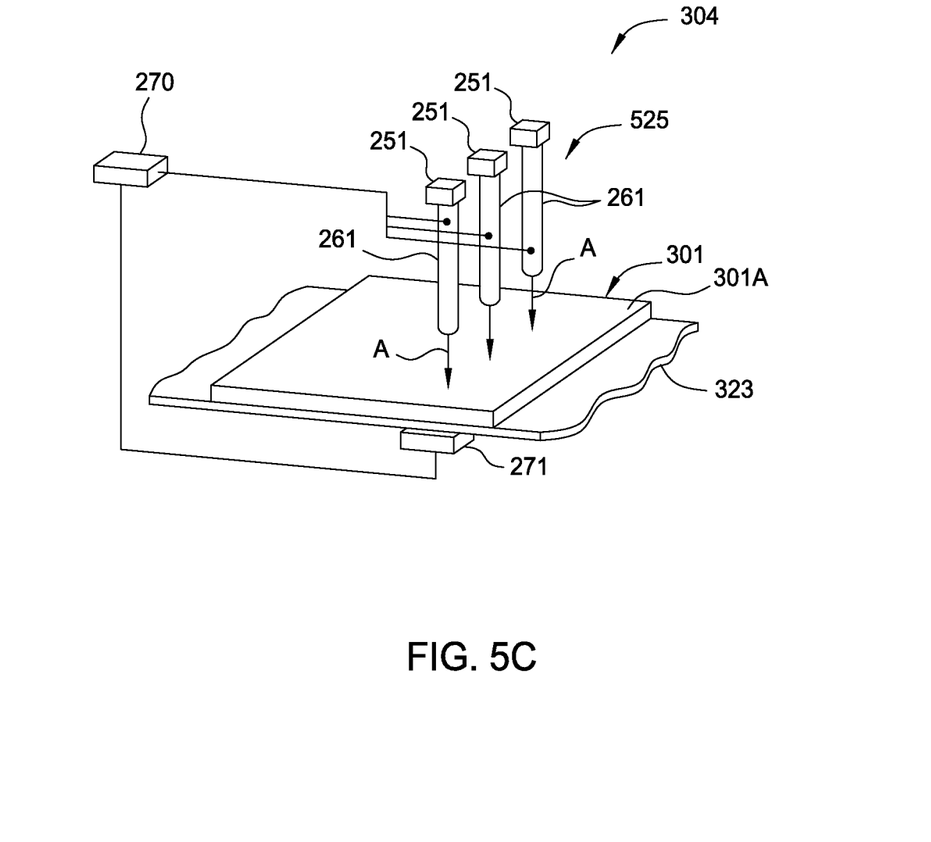
FIG. 5C is a schematic side view of an apparatus used to deposit nanofibers on a substrate according to one embodiment of the invention.

FIG. 5C is an isometric view of one embodiment of the electrospinning material delivery system 525 that includes a plurality of nozzles 261 that each can be configured to separately deposit strands of the electrically-insulating nanofibers on different regions of the surface 301A of the substrate 301. In this configuration, the conductive nozzles 261 are positioned to deposit the electrically-insulating nanofibers over adjacent regions of the surface 301A of the substrate 301 to provide relatively uniform coverage of the large surface area substrate 301. In one embodiment, the conveyor belt material 323 is configured to support and translate the substrate 301 during the electrospinning process (Step 204) to uniformly deposit the electrically-insulating nanofibers by use of commands sent from the controller 305 to the conveyor 322. In an alternate embodiment, the conductive nozzles 261 are moved relative to the substrate 301 during the deposition process.

Figure 5D:
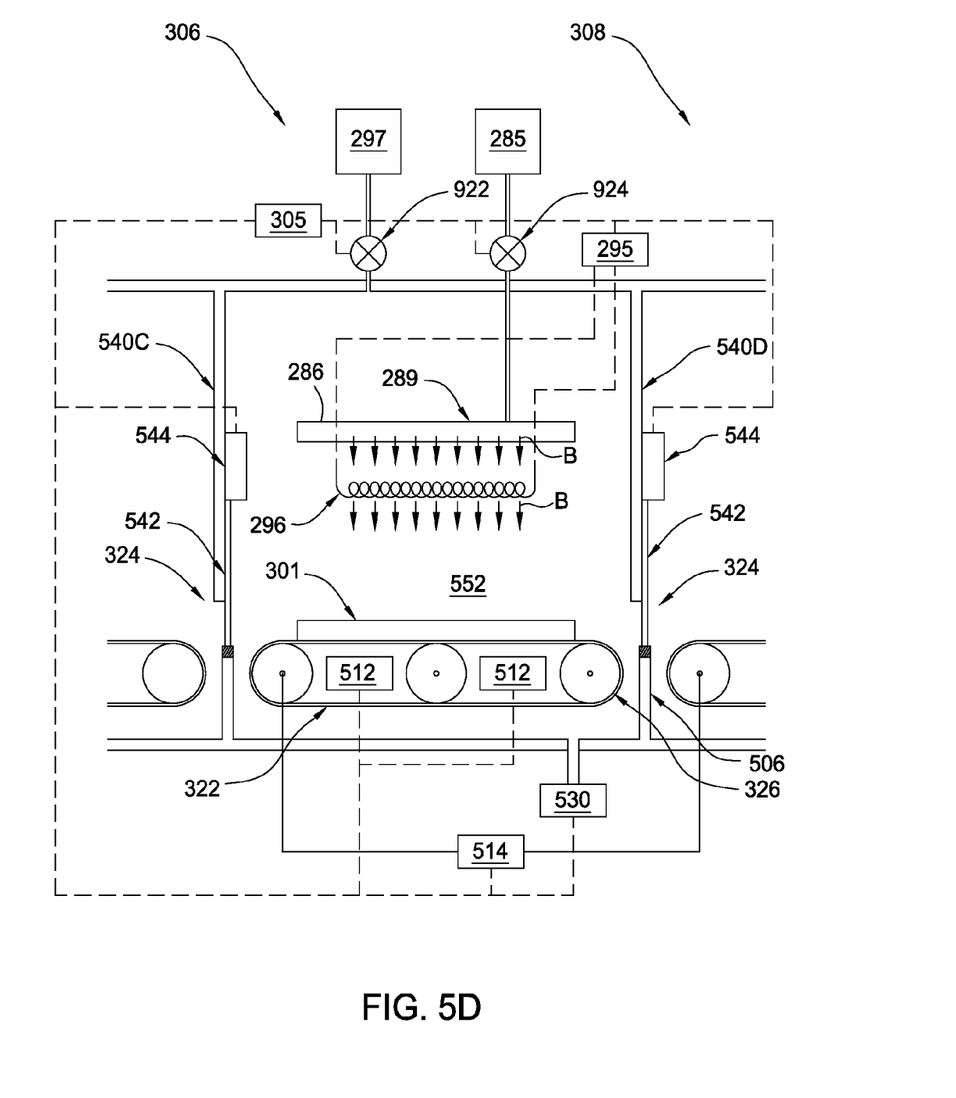
FIG. 5D is a schematic side view of a chamber for processing the deposited nanofibers according to one embodiment of the invention.

FIG. 5D is a schematic side view of one embodiment of a chamber 306 that can be adapted to process the deposited electrically-insulating nanofibers, as discussed in above in conjunction with step 206. In one embodiment, chamber 306 comprises a gas delivery device 289, one or more heated filaments 296, a conveyor 322, gas sources 297 and 285, one or more substrate temperature controlling elements 512, a pump 530, one or more door assemblies 542 and one or more walls that enclose a processing region 552. In one configuration, the one or more walls of the chamber 306 include a top wall 502, a first wall 540C disposed between chamber 304 and chamber 306, a second wall 540D disposed between chamber 306 and chamber 308 and a lower wall 506.

In one embodiment, during processing, an activated processing gas is formed by flowing a process gas through the gas delivery device 289 and then across one or more of the heated filaments 296 that are heated to a desirable temperature by the delivery of power from the power source 295. Also, during processing, one or more of the substrate temperature controlling elements 512 and a pumping device 530 can be used to control the temperature of the substrate, which is disposed on the conveyor 322, and the processing pressure in the processing region 552 can be adjusted by use of commands sent from the controller 305. In one embodiment, the pressure level of the processing region 552 of the chamber 306 may be maintained at less than about 760 Torr. In one embodiment, the pressure level of the processing region 552 of the chamber 306 may be maintained at about 90 mTorr or less.

Figure 5E:
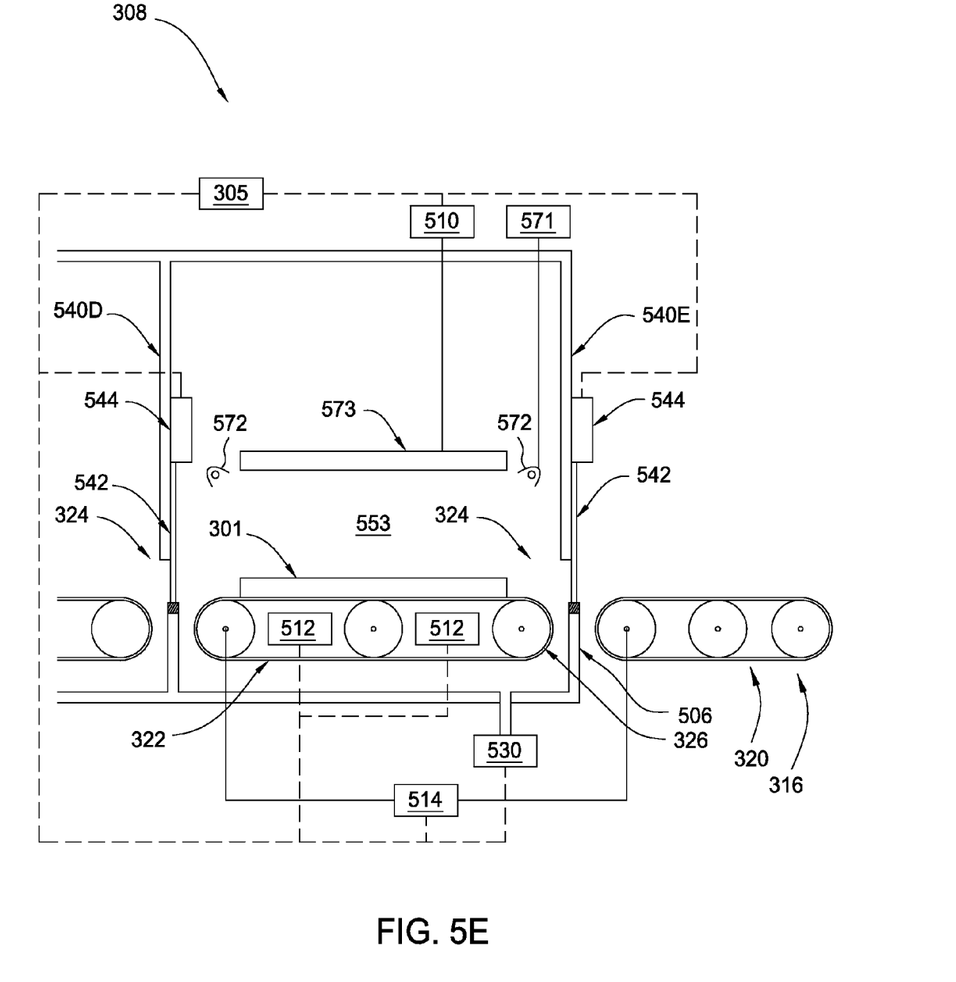
FIG. 5E is a schematic side view of a chamber for forming and/or further processing a substrate to at least form a part of an electronic device according to one embodiment of the invention.

FIG. 5E is a schematic side view of one embodiment of a chamber 308 that can be adapted to further process the formed nanowires, as discussed in above in conjunction with at least one of the steps 208-210. In one configuration, chamber 308 may comprise a gas delivery device 573, one or more heat sources 572, a conveyor 322, gas sources 571, one or more substrate temperature controlling elements 512, a pump 530, one or more door assemblies 542 and one or more walls that enclose a processing region 553. In one configuration, the one or more walls of the chamber 308 include a top wall 502, a first wall 540D disposed between chamber 306 and chamber 308, a second wall 540E disposed between chamber 306 and chamber 308, and a lower wall 506. In one example, the gas delivery device 573 is adapted to deliver a precursor gas to a surface of the substrate 301 to form a TCO layer (e.g., ZnO) thereon using a CVD type deposition process. In another example, the one or more heat sources 572 are used to thermally process the formed nanowires to cause recrystallization and/or densification of the nanowires to improve the interconnection between the nanowires and the overall conductivity of the formed conductive layer. In yet another example, the gas delivery device 573 is adapted to deliver a silicon containing precursor gas (e.g., silane) and hydrogen gas to a surface of the substrate 301 to form at least a portion of an active solar cell device, such as one of the p-i-n layers of a solar cell using a CVD type deposition process.

While the foregoing is directed to embodiments of the present invention, other and further embodiments of the invention may be devised without departing from the basic scope thereof, and the scope thereof is determined by the claims that follow.

The invention claimed is:

1. A method of forming a conductive layer on a substrate, comprising:
    depositing a metal salt containing polymeric material on a surface of the substrate;
    reducing a pressure in a processing region of a first processing chamber to a pressure less than 760 Torr;
    heating the substrate, which is disposed in the processing region, to a first temperature between about 25° C. and about 250° C.; and
    exposing the deposited metal salt containing polymeric material to an activated process gas delivered from a gas delivery device disposed in the processing region.

2. The method of claim 1, wherein the activated process gas comprises a reducing gas.

3. The method of claim 1, wherein the activated process gas comprises hydrogen ($H_2$).

4. The method of claim 1, wherein the metal salt containing polymeric material comprises a metal selected from a group comprising copper (Cu), silver (Ag), titanium (Ti), zinc (Zn), tin (Sn), gold (Au), platinum (Pt), palladium (Pd), nickel (Ni), magnesium (Mg) and cobalt (Co).

5. The method of claim 1, further comprising depositing a transparent conductive oxide layer over the deposited metal salt containing polymeric material after exposing the deposited metal salt containing polymeric material to the activated process gas.

6. The method of claim 1, further comprising depositing a first doped silicon containing layer over the deposited metal salt containing polymeric material after exposing the deposited metal salt containing polymeric material to the activated process gas.

7. The method of claim 6, wherein the first doped silicon containing layer is a layer in a solar cell device.

8. A method of forming a conductive layer on a substrate, comprising:
    depositing a metal salt containing polymeric material on a surface of the substrate;
    delivering a process gas across one or more wires that are heated to a first temperature; and
    exposing the deposited metal salt containing polymeric material to the process gas after it has been delivered across the one or more heated wires.

9. The method of claim 8, wherein the process gas comprises a reducing gas.

10. The method of claim 8, wherein the process gas comprises hydrogen (H2).

11. The method of claim 8, wherein the metal salt containing polymeric material comprises a metal selected from a group comprising copper (Cu), silver (Ag), titanium (Ti), zinc (Zn), tin (Sn), gold (Au), platinum (Pt), palladium (Pd), nickel (Ni), magnesium (Mg) and cobalt (Co).

12. The method of claim 8, wherein the first temperature is between 1700 and 2200° C.

13. The method of claim 8, wherein exposing the deposited metal salt containing polymeric material to the process gas further comprises:
   positioning the surface of the substrate a first distance from the one or more wires; and
   retaining the surface of the substrate at the first distance to allow the heat emitted from the one or more wires to heat the surface to a second temperature.

14. The method of claim 13, wherein the second temperature is between about 25° C. and about 250° C.

15. The method of claim 8, wherein exposing the deposited metal salt containing polymeric material to the process gas is performed in a processing region of a first chamber, and wherein the method further comprises:
   reducing a pressure in the processing region to a pressure between about 1 mTorr and 760 Torr.

16. The method of claim 8, wherein
   the first temperature is between 1700 and 2200° C.,
   the process gas comprises hydrogen ($H_2$), and
   exposing the deposited metal salt containing polymeric material to the process gas further comprises:
      positioning the surface of the substrate a first distance from the one or more wires; and
      retaining the surface of the substrate at the first distance for at least 1 minute to allow the heat emitted from the one or more wires to heat the surface to a temperature between about 25° C. and about 250° C.

17. The method of claim 8, further comprising depositing a transparent conductive oxide layer over the deposited metal salt containing polymeric material after exposing the deposited metal salt containing polymeric material to the process gas.

18. The method of claim 8, further comprising depositing a first doped silicon containing layer over the deposited metal salt containing polymeric material after exposing the deposited metal salt containing polymeric material to the process gas.

19. The method of claim 18, wherein the first doped silicon containing layer is a layer in a solar cell device.

* * * * *